(12) United States Patent
Stevens (10) Patent No.: US 6,860,965 B1
(45) Date of Patent: Mar. 1, 2005

(54) HIGH THROUGHPUT ARCHITECTURE FOR SEMICONDUCTOR PROCESSING

(75) Inventor: Craig Lyle Stevens, Ben Lomond, CA (US)

(73) Assignee: Novellus Systems, Inc., San Jose, CA (US)

( * ) Notice: Subject to any disclaimer, the term of this patent is extended or adjusted under 35 U.S.C. 154(b) by 52 days.

(21) Appl. No.: 09/888,017

(22) Filed: Jun. 21, 2001

Related U.S. Application Data (60) Provisional application No. 60/213,386, filed on Jun. 23, 2000.

(51) Int. Cl.[7] .......................... C23F 1/00; H01L 21/306; C23C 16/00; B65G 49/07
(52) U.S. Cl. .......................... 156/345.32; 156/345.31; 156/345.52; 156/345.53; 118/719; 118/724; 118/725; 414/939; 204/298.25
(58) Field of Search ..................... 204/298.25; 118/724, 118/725, 719; 156/345.31, 345.32

(56) References Cited

U.S. PATENT DOCUMENTS

| | | | |
|---|---|---|---|
| 3,202,406 A | 8/1965 | Tack | |
| 4,042,128 A | 8/1977 | Shrader | 214/17 B |
| 4,220,899 A | 9/1980 | Von Der Heide | |
| 4,228,358 A | 10/1980 | Ryding | 250/457 |
| 4,560,911 A | 12/1985 | Chitayat | |
| 4,604,020 A | 8/1986 | Toro Lira et al. | |
| 4,604,027 A | 8/1986 | Becker et al. | |
| 4,619,573 A | 10/1986 | Rathman et al. | |

(List continued on next page.)

FOREIGN PATENT DOCUMENTS

| | | | |
|---|---|---|---|
| FR | 2 766 028 A1 | 1/1999 | |
| JP | 410178083 A | 6/1998 | |

OTHER PUBLICATIONS

"Operator's Handbook," MB[2] Modular Sputtering System, *Varian Semiconductor Equipment*, TFS Technical Publications, Oct., 1994, Table of Contents, i–iv; pp. 1–2, 2–1, 2–6; 3–1, 3–2; 4–1; 4–4; 5–24.

"Drawings & Schematics Manual" Backbone vol. 1 MB[2] Modular Sputtering System, *Varian Semiconductor Equipment*, TFS Technical Publications, Jun. 1996, Table of Contents, i–vii; Index by Drawing Title, viii–xiii; Index by Drawing No., xiv–xix.

"Various Engineering Drawings for Varian Semiconductor Processing System," *Varian Associates*, Exact Dates Unknown, pp. 244 245, 247–272–274–1.

John F. O'Hanlon, et al: "Reduction of water aerosol contamination during pumping of a vacuum chamber from atmospheric pressure" *American Vacuum Society*, J. Vac.Sci. Technol. A 9 (5); Sep./Oct. 1991, pp. 2802–2807.

*Primary Examiner*—Parviz Hassanzadeh
*Assistant Examiner*—Karla Moore
(74) *Attorney, Agent, or Firm*—Okamoto & Benedicto LLP (57) ABSTRACT

In one embodiment, a wafer processing system has a loading station, a process module, and a load lock directly adjacent to the process module. The load lock has a small volume and can include integrated heating/cooling units. The load lock also has a wafer transfer mechanism for placing a wafer directly to the process module. The wafer processing system does not employ a transfer chamber to transport wafers between the load lock and the process module. Instead, a wafer is directly transferred from the load lock to the process module using the wafer transfer mechanism. Not requiring a transfer chamber not only improves the throughput of the wafer processing system, but also lowers its complexity and component count as well. The throughput of the wafer processing system is also improved by using a small volume load lock with integrated cooling/heating units.

15 Claims, 12 Drawing Sheets

U.S. PATENT DOCUMENTS

| | | | | |
|---|---|---|---|---|
| 4,705,951 A | | 11/1987 | Layman et al. | 250/442.1 |
| 4,795,299 A | | 1/1989 | Boys et al. | 414/217 |
| 4,851,101 A | | 7/1989 | Hutchinson | 204/298 |
| 4,917,556 A | | 4/1990 | Stark et al. | 414/217 |
| 4,923,584 A | * | 5/1990 | Bramhall et al. | 204/298.25 |
| 4,927,484 A | * | 5/1990 | Mitomi | 156/345.32 |
| 5,135,608 A | | 8/1992 | Okutani | 156/643 |
| 5,186,594 A | | 2/1993 | Toshima et al. | 414/217 |
| 5,186,718 A | | 2/1993 | Tepman et al. | 29/25.01 |
| 5,199,483 A | | 4/1993 | Bahng | |
| 5,229,669 A | | 7/1993 | Takei | |
| 5,281,320 A | | 1/1994 | Turner et al. | |
| 5,302,209 A | * | 4/1994 | Maeda et al. | 118/719 |
| 5,314,541 A | | 5/1994 | Saito et al. | 118/725 |
| 5,330,633 A | * | 7/1994 | Matsumoto et al. | 204/298.25 |
| 5,340,261 A | * | 8/1994 | Oosawa et al. | 414/217 |
| 5,344,542 A | | 9/1994 | Maher et al. | |
| 5,512,320 A | | 4/1996 | Turner et al. | 427/255 |
| 5,518,542 A | | 5/1996 | Matsukawa et al. | 118/52 |
| 5,674,368 A | * | 10/1997 | Hashimoto et al. | 204/298.25 |
| 5,676,590 A | | 10/1997 | Hiraoka | 451/287 |
| 5,679,405 A | * | 10/1997 | Thomas et al. | 427/248.1 |
| 5,753,133 A | | 5/1998 | Wong et al. | 216/67 |
| 5,789,878 A | | 8/1998 | Kroeker et al. | |
| 5,833,426 A | | 11/1998 | Marohl | |
| 5,876,556 A | | 3/1999 | Takanami | |
| 5,882,165 A | | 3/1999 | Maydan et al. | 414/217 |
| 5,900,105 A | * | 5/1999 | Toshima | 156/345.31 |
| 5,902,088 A | | 5/1999 | Fairbairn et al. | 414/217 |
| 5,951,770 A | | 9/1999 | Perlov et al. | 118/719 |
| 5,961,722 A | | 10/1999 | Buhrer et al. | 118/712 |
| 6,007,675 A | | 12/1999 | Toshima | 156/345 |
| 6,042,324 A | * | 3/2000 | Aggarwal et al. | 414/411 |
| 6,048,154 A | | 4/2000 | Wytman | 414/217 |
| 6,251,759 B1 | | 6/2001 | Guo et al. | |
| 6,270,582 B1 | | 8/2001 | Rivkin et al. | |
| 6,271,606 B1 | | 8/2001 | Hazelton | |
| 6,305,895 B1 | | 10/2001 | Ozawa | |
| 6,375,746 B1 | | 4/2002 | Stevens et al. | |
| 6,431,807 B1 | * | 8/2002 | Stevens et al. | 414/217 |
| 2001/0041122 A1 | | 11/2001 | Kroeker | |
| 2002/0031420 A1 | * | 3/2002 | Kroeker | 414/217 |
| 2002/0033136 A1 | * | 3/2002 | Savage et al. | 118/719 |

* cited by examiner

Not To Scale

HIGH THROUGHPUT ARCHITECTURE FOR SEMICONDUCTOR PROCESSING

CROSS-REFERENCE TO RELATED APPLICATION

This application claims the benefit of and incorporates by reference in its entirety U.S. Provisional Application No. 60/213,386, filed on Jun. 23, 2000, entitled "High Throughput Architecture For Semiconductor Processing."

BACKGROUND OF THE INVENTION

1. Field of the Invention

The present invention relates generally to semiconductor device fabrication, and more particularly to semiconductor wafer processing systems.

2. Description of the Background Art

A typical semiconductor wafer processing system has a process module (also known as a "reactor" or "process chamber") for processing semiconductor wafers and wafer handling modules for moving the wafers in and out of the process chamber. Process modules are available for chemical vapor deposition, physical vapor deposition, etching, electro-plating/electro-fill, and other semiconductor device fabrication processes. For example, a chemical vapor deposition module may be used to deposit a film of dielectric material on a wafer.

Wafer handling modules employ manipulators, such as robots, for transporting wafers between two locations of a wafer processing system. A wafer placed in a loading station is picked-up by a robot and goes through a series of intermediate chambers before reaching the process module where the wafer is processed. In a so-called cluster tool, these intermediate chambers may include aligners, indexers, load locks, transfer chambers, heating stations, and cooling stations. For example, a wafer is ordinarily transferred from a load lock to a process module via an intermediate transfer chamber, which houses a vacuum robot for handling the wafer.

Throughput is a measure of the processing speed of a wafer processing system. The higher the throughput, the more wafers that can be processed within a given amount of time. Thus, it is desirable to have a wafer processing system with high throughput.

It is also desirable to minimize the component count of the wafer processing system. Low component count not only decreases the cost of the wafer processing system, but makes it more reliable as well.

SUMMARY

The present invention relates to a high throughput architecture for a semiconductor wafer processing system.

In one embodiment, a wafer processing system has a loading station, a process module, and a load lock adjacent to the process module. The load lock has a small volume and may include integrated heating/cooling units. The load lock also has a wafer transfer mechanism for placing a wafer directly to the process module.

In one embodiment, a wafer is processed in the present wafer processing system by placing a wafer in a load lock; pumping down the load lock to vacuum; moving the wafer directly to a process module; and processing the wafer in the process module.

Unlike a conventional cluster tool, the present wafer processing system does not have a transfer chamber between the load lock and the process module. Instead, a wafer is directly transferred from a load lock to the process module using the wafer transfer mechanism. Not having a transfer chamber improves the throughput of the wafer processing system and also lowers its complexity and component count.

The throughput of the present wafer processing system is also improved by using a small volume load lock with integrated cooling/heating units. The small volume of the load lock results in fast pump down and vent cycles, while the integrated cooling/heating units allow for cooling/heating of a wafer while the wafer is in a load lock (i.e., the wafer does not have to be transferred to a separate cooling/heating station, or be pre-heated in a process module).

These and other features and advantages of the present invention will be readily apparent to persons of ordinary skill in the art upon reading the entirety of this disclosure, which includes the accompanying drawings and claims.

BRIEF DESCRIPTION OF THE DRAWINGS

The same label used in different figures indicates the same or like elements.

DETAILED DESCRIPTION

Figure 1A:
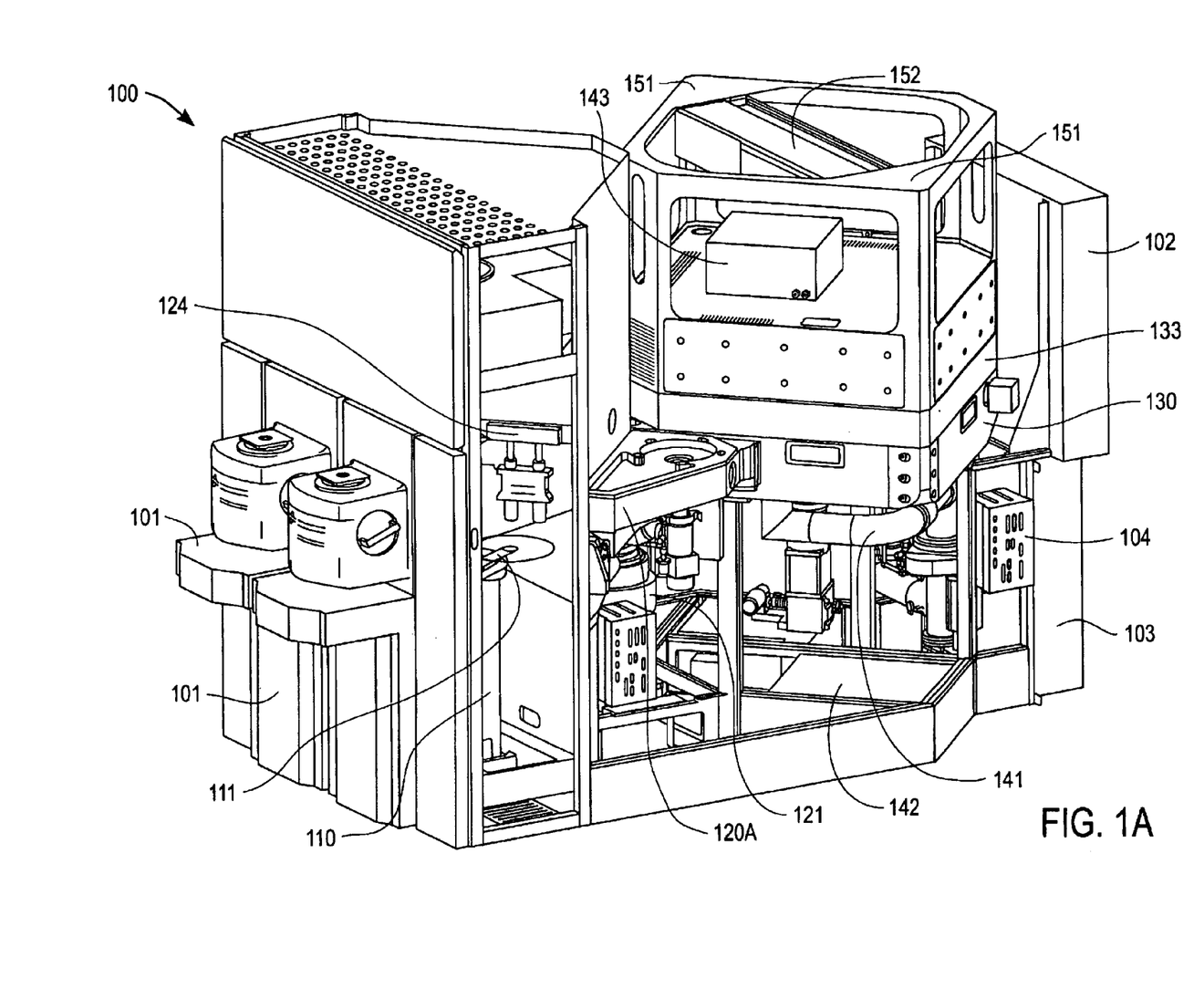
FIGS. 1A, 1B, and 1C show perspective views of a wafer processing system in accordance with an embodiment of the present invention.

Referring now to FIG. 1A, there is shown a wafer processing system 100 in accordance with an embodiment of the present invention. System 100 includes a loading station 101 where wafers to be processed are loaded. In the present embodiment, loading station 101 has one or more front-opening unified pods (FOUP) such as the type available from Brooks Automation, Inc. of Chelmsford, Mass. Loading station 101 may also be configured to accept any loader generally used in the semiconductor industry including standard mechanical interface (SMIF) pods, cassette modules, and automated guided vehicle (AGV) interfaces.

Figure 1B:
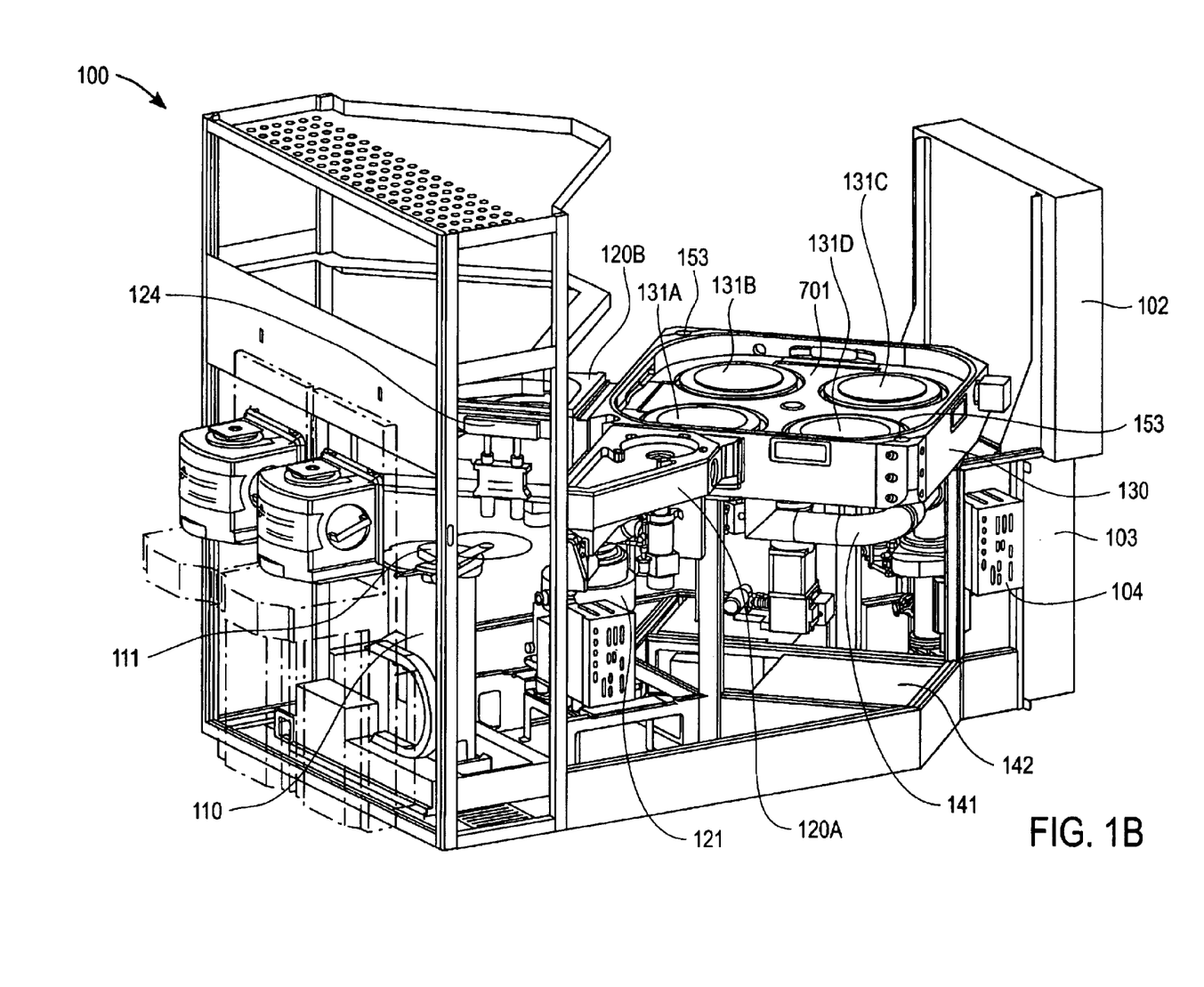

An arm 111 of a robot 110 picks up a wafer from loading station 101 and transfers the wafer to a load lock 120 (i.e., load lock 120A or load lock 120B shown in FIG. 1B). In this embodiment, robot 110 is a commercially available atmospheric robot from Brooks Automation, Inc. Other wafer handling robots may also be used. From loading station 101, the wafer enters the load lock 120 through an opening on a side of the load lock facing robot 110. For example, the opening of load lock 120B facing robot 110 is shown in FIG. 1B as being vacuum sealed by a slit valve 124. It is to be noted that load locks 120A and 120B are mirror images of one another. Accordingly, load lock 120A also has a slit valve 124 on its opening facing robot 110. Each load lock 120 also has an opening (not shown) facing a directly adjacent process module 130. In this embodiment, the slit valves used to gate both openings of a load lock 120 are pneumatically actuated slit valves from VAT Holding AG of Switzerland. Other types of slit valves from other vendors may also be used.

Figure 2A:
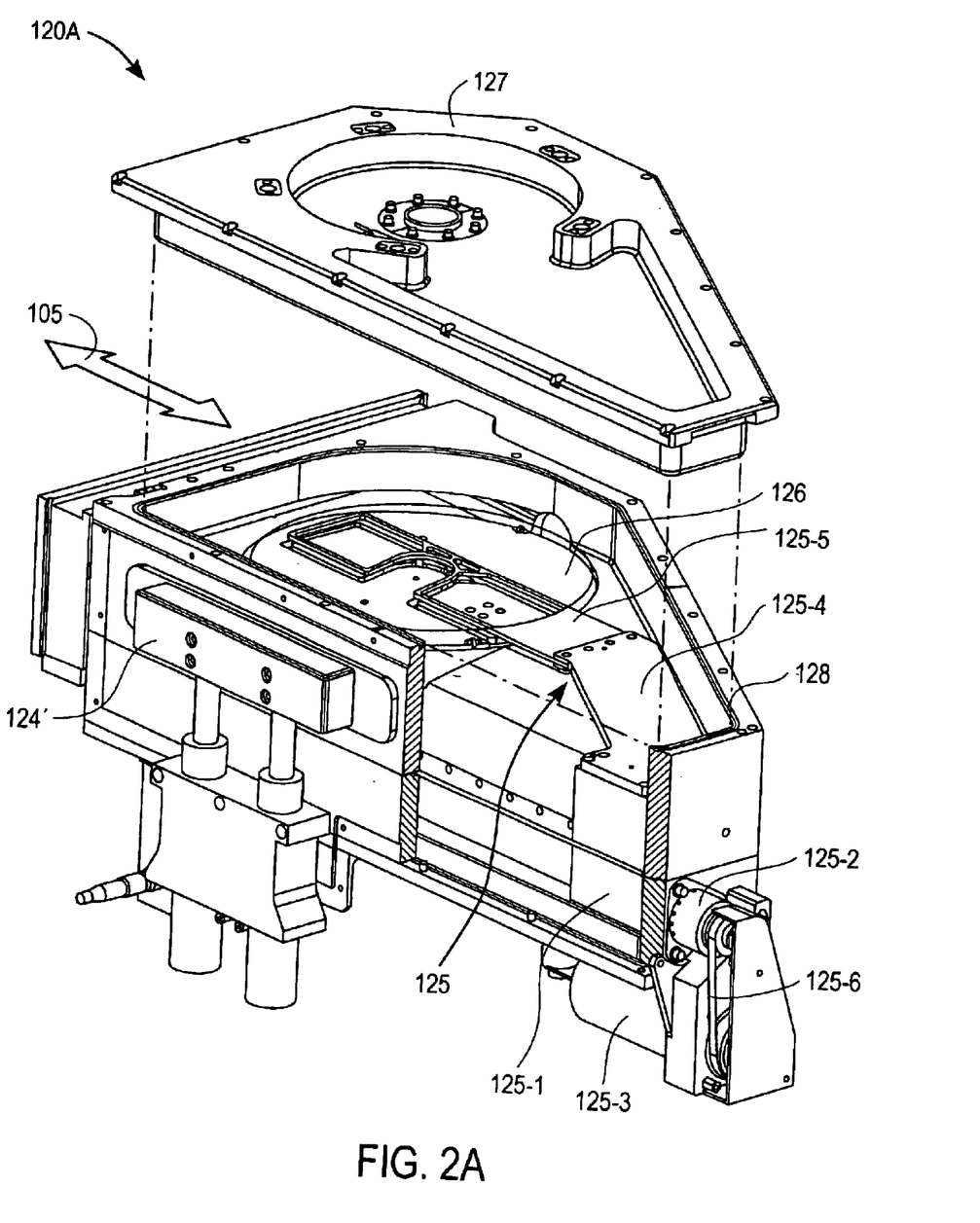
FIGS. 2A, 2B, and 2C show various views of a load lock in accordance with an embodiment of the present invention.

FIG. 2A shows a perspective, partial x-ray view of a load lock 120A. As mentioned, the following discussion regarding load lock 120A is equally applicable to load lock 120B. As shown in FIG. 2A, a top cover 127 goes on top of load lock 120A and contacts a sealant, such as an o-ring, in a groove 128 to maintain a vacuum seal. During pump downs of load lock 120A to vacuum, the slit valve 124 facing robot 110 (shown in FIGS. 2A and 2B as slit valve 124') and the slit valve 124 facing process module 130 (shown in FIG. 2C as slit valve 124") are pneumatically actuated to the up (i.e., closed) position.

Load lock 120A, which is a single-wafer load lock, can only accommodate one wafer at a time and has a correspondingly small volume of approximately 10 liters. The small volume of load lock 120A helps improve the throughput of system 100 by allowing for fast pump down and vent cycles. Load lock 120A also houses a single-axis wafer transfer mechanism 125, which includes a carriage assembly 125-1, a ball screw assembly 125-2, a servo motor 125-3, a support-piece 1254, and an end-piece 125-5. When a pedestal 126 is in the down position, arm 111 of robot 110 moves a wafer inside load lock 120A and lowers the wafer on end-piece 125-5. The middle section of end-piece 125-5 is "U" shaped to provide clearance for arm 111 as it lowers the wafer. The portion of end-piece 125-5 that supports the wafer is a wire frame and fits a cut-out on pedestal 126. When pedestal 126 is transitioned to the up position, the wafer support portion of end-piece 125-5 sinks into the cut-out, thereby resting the wafer on pedestal 126. The wafer is lowered back onto end-piece 125-5 by transitioning pedestal 126 to the down position.

Referring to wafer transfer mechanism 125, end-piece 125-5 is attached to support piece 1254, which in turn is attached to carriage assembly 1251. Carriage assembly 125-1 rides on ball screw assembly 125-2, which is coupled to servo motor 125-3 via belt 125-6. By actuating servo motor 125-3, end-piece 125-5 is driven towards or away from process module 130 along a path indicated by arrow 105. The so drive components of wafer transfer mechanism 125 may be coupled using magnetic or mechanical means without impacting the efficacy of the present invention. As: can be appreciated by persons of ordinary skill in the art, wafer transfer mechanism 125 is simpler, smaller, and costs less than a typical vacuum robot.

Another wafer transfer mechanism that may also be employed in the present invention is disclosed in commonly-assigned U.S. application Ser. No. 09/887,202, filed on Jun. 21, 2001, entitled "Magnetically Coupled Linear Servo-Drive Mechanism," by Thomas Pratt, Scott McClelland, Craig L. Stevens, and Keiry Hopkins. The just mentioned application is incorporated herein by reference in its entirety. It is to be noted that the present invention is not limited to wafer transfer mechanisms of the type disclosed in the just mentioned application or the present disclosure. For example, wafer transfer between a load lock 120 and process module 130 may also be performed using a vacuum robot located either inside the load lock 120 or process module 130.

Figure 2B:
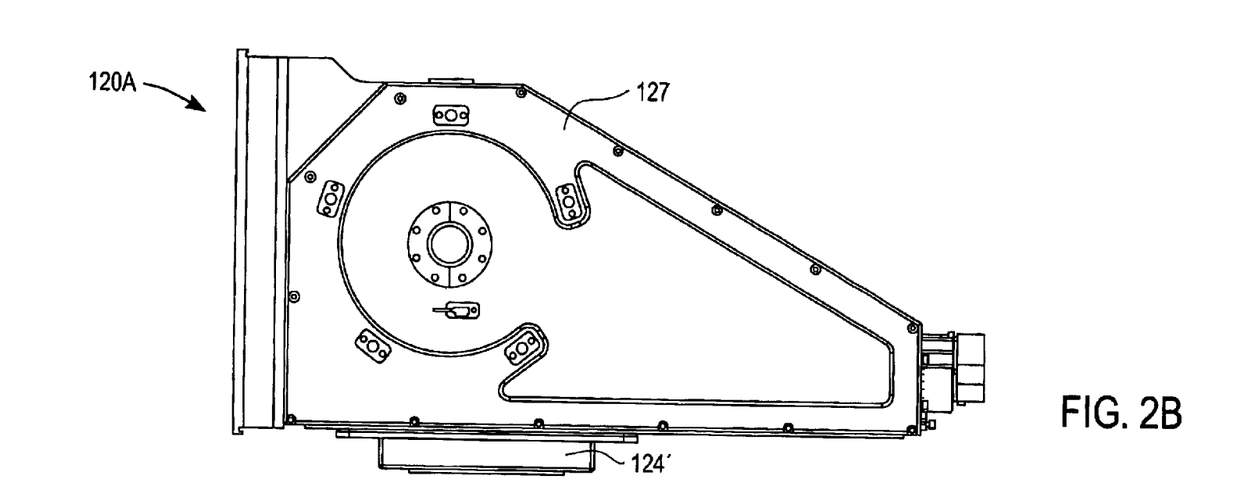
Figure 2C:
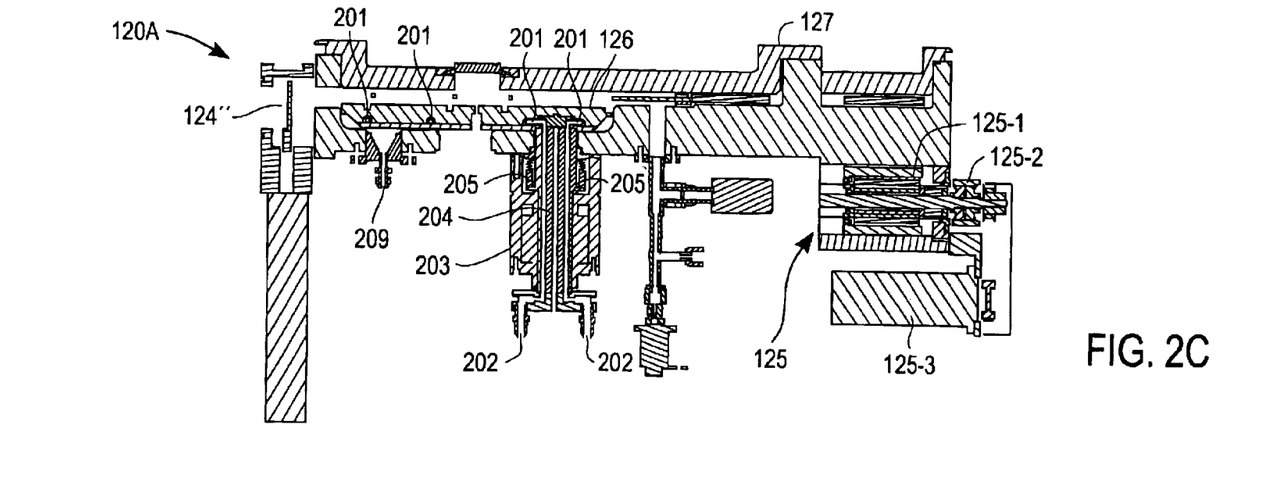

FIG. 2B shows a top view of load lock 120A while FIG. 2C shows a corresponding side cross-sectional view. Referring to FIG. 2C, pedestal 126 includes an embedded channel 201 through which a coolant may be flown to cool a supported wafer. In the present embodiment, water at a temperature of 20° C. is flown through channel 201 via port 202 for cooling. The capability to cool the wafer in the load lock 120 during vent eliminates the need to move the wafer to a separate cooling station thereby improving the throughput of system 100.

A wafer may also be heated while supported on pedestal 126 by flowing heated liquid through embedded channel 201 or, alternatively, by activating heating elements (e.g., resistors) embedded in pedestal 126. The wafer may also be heated inside the load lock 120 using other techniques including by radiation. For fabrication processes requiring the wafer to be pre-heated to a certain temperature prior to processing, heating the wafer in the load lock 120 during pump down further improves throughput by eliminating the need to pre-heat the wafer in a separate heating station or in the process module.

FIG. 2C also shows an air cylinder 203 for lowering and raising pedestal 126. Inside cylinder 203 is a pedestal lift 204 that is fixedly attached to pedestal 126. Actuating air cylinder 203 moves pedestal lift 204 and pedestal 126 in the vertical direction. Bellows 205 maintain a vacuum seal around pedestal lift 204.

Besides those described herein, other suitable pedestals, load locks, and techniques for cooling/heating a wafer inside a load lock that may be employed in the present invention are discussed in the following commonly-assigned disclosures, which are incorporated herein by reference in their entirety: U.S. patent application Ser. No. 09/346,258, entitled "Wafer Processing Architecture For Maximum Throughput", filed on Jun. 30, 1999; U.S. patent application Ser. No. 09/409,841, entitled "Wafer Processing Architecture Including Load Locks", filed on Sep. 30, 1999; and U.S. patent application Ser. No. 09/635,998, entitled "Apparatus and Method For Semiconductor Wafer Cooling, Heating, And Backside Particle Control", filed on Aug. 9, 2000.

Referring to FIG. 1A and FIG. 2A, arm 111 of robot 110 picks up a wafer from loading station 101 and moves the wafer through an opening of a load lock 120 facing robot 110. Inside the load lock 120, robot 110 lowers the wafer on end-piece 125-5 of wafer transfer mechanism 125. Pedestal 126 is raised and thereby lifts the wafer from end-piece 125-5. Simultaneously, all the openings of the load lock 120 are then closed by raising the slit valves 124. The load lock 120 is then pumped down to vacuum. Depending on the fabrication process, the wafer may be heated on pedestal 126 while the load lock 120 is being pumped down. In the present embodiment, load lock 120A and load lock 120B are pumped down using a vacuum pump 121 locally located on the main frame of system 100. Using a separate, local pump, instead of sharing a remotely located pump with other modules, allows for better control of the pressure in the load locks. In this embodiment, pump 121 is a drag pump of the type available from BOC Edwards of England. Other pumps generally used for semiconductor processing may also be used.

After the load lock 120 is pumped down to vacuum, the opening of the load lock 120 facing process module 130 is opened. Pedestal 126 lowers the wafer on end-piece 125-5 of wafer transfer mechanism 125, which is then actuated towards process module 130. Lift pins in the first processing station of process module 130 (later described with reference to FIG. 7C) lift the wafer from end-piece 1255. Thereafter, wafer transfer mechanism 125 is retracted from process module 130, and the opening of the load lock 120 facing process module 130 is closed. As can be appreciated, there is no transfer chamber between the load lock 120 and process module 130.

In the present embodiment, process module 130 is a multi-station process module. However, in light of the present disclosure, persons of ordinary skill in the art will appreciate that process module 130 may also be a single-station process module. During normal operation, process module 130 is continually maintained under vacuum using a remotely located vacuum pump. In accordance with conventional nomenclature, the term "vacuum" generally refers to some low pressure suitable for semiconductor processing, and does not necessarily mean zero pressure. Of course, the specific operating pressures of process module 130 and the load locks depend on specific process requirements. As shown in FIG. 1A, process module 130 includes an RF (radio frequency) match unit 143 for matching the impedance of process module 130 with that of an RF generator (not shown) supplying RF power to the process module. Process gases are introduced into process module 130 via a multi-channel gas box 103.

Still referring to FIG. 1A, foreline 141, and other plumbing, wiring, and frame supports of process module 130 are located away from the vicinity of surface 142 to improve the accessibility of system 100 to maintenance personnel. Note that there is enough space underneath the side portions of process module 130 for maintenance personnel to crawl through.

Figure 6:
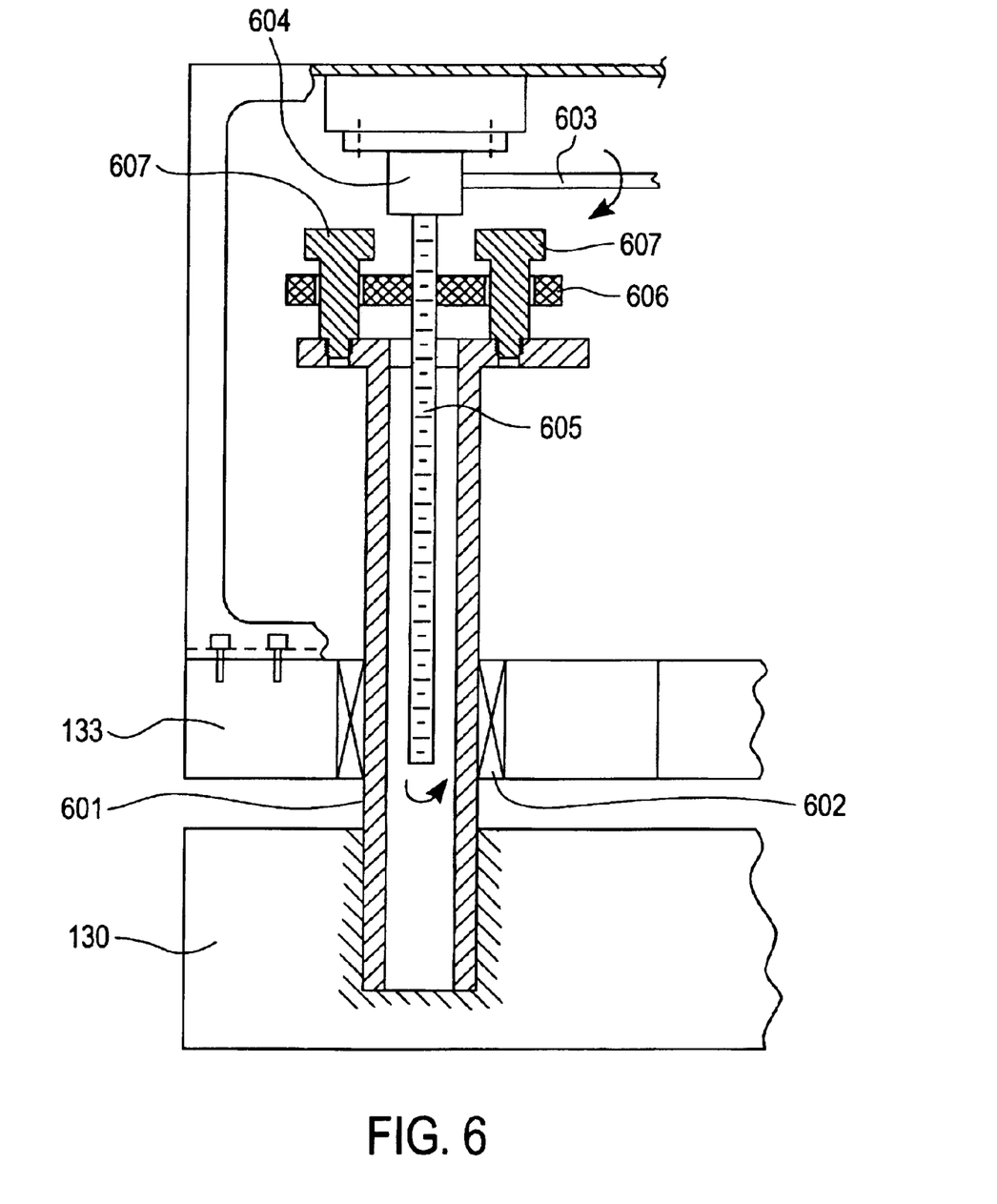
FIG. 6 schematically illustrates an arrangement for lifting a top plate above a process module in accordance with an embodiment of the present invention.

FIG. 1B shows process module 130 with its top plate 133 removed. To gain access to the inside of process module 130 during maintenance, top plate 133 is raised using a shaft and lead screw arrangement shown in the schematic diagram of FIG. 6. Top plate 133 slides up and down a shaft 601, which is fixedly clamped to process module 130. Contact between shaft 601 and top plate 133 is via bushings 602. To vertically move top plate 133, a motor (not shown) rotates a shaft 603 coupled to a miter gear box 604, which in turn rotates a lead screw 605. Lead screw 605 is coupled to shaft 601 via a nut 606 and over travel screws 607. As shaft 603 rotates, lead screw 605 rotates about nut 606, thereby vertically moving top plate 133. Over travel screws 607 and limit switches (not shown) are used to limit the range of motion of top plate 133. In the present embodiment, the shaft and lead screw arrangement of FIG. 6 is employed on two corners of process module 130 generally indicated in FIG. 1A as areas 151. The motor used to drive shaft 603 is located in a bridge 152. The spot where shafts 601 go through are shown in FIG. 1B as holes 153. As can be appreciated, lifting top plate 133 from the top frees up space underneath process module 130, thereby improving the accessibility of system 100 to maintenance personnel.

Figure 7A:
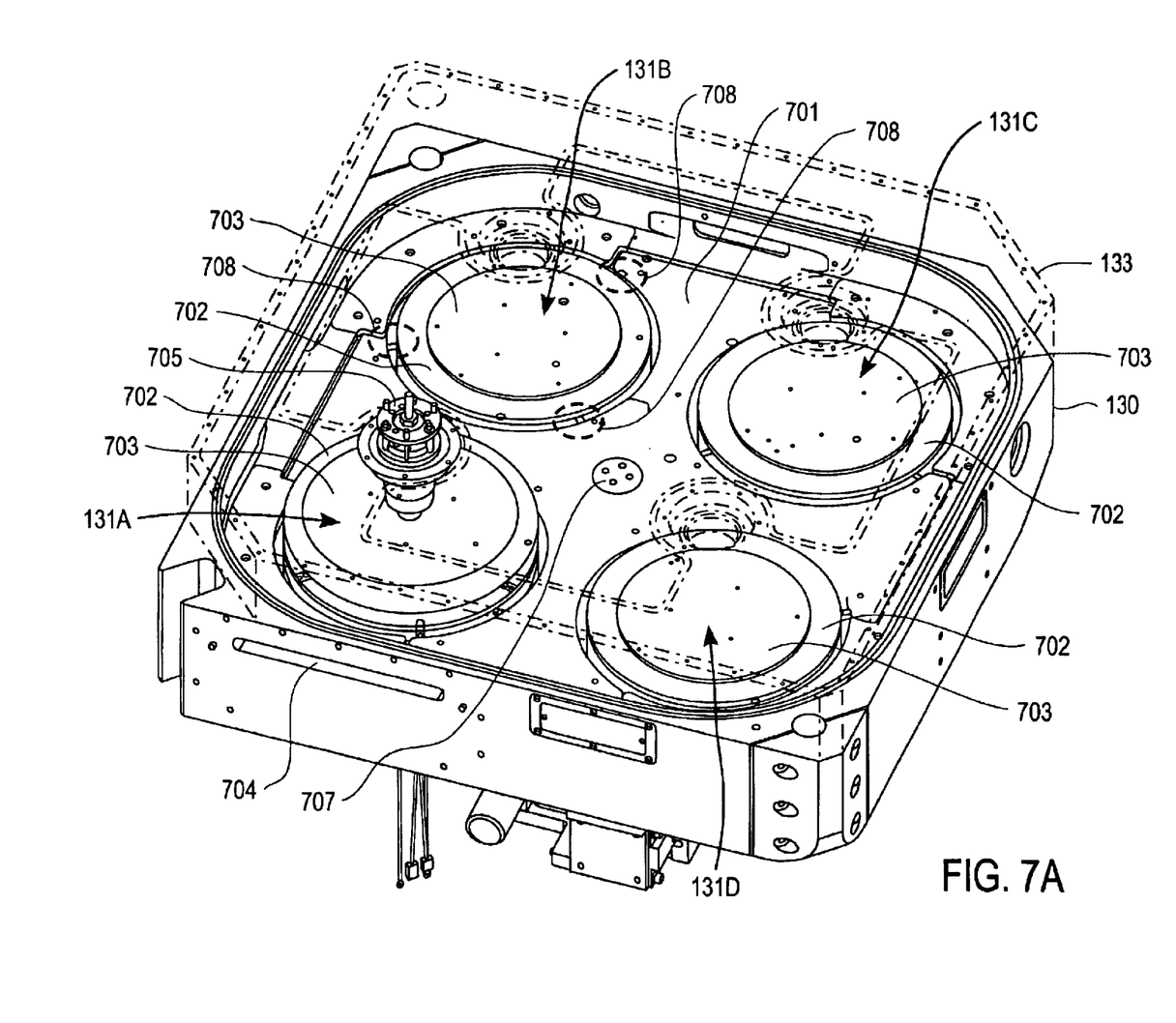
FIGS. 7A and 7C show perspective views of a process module in accordance with an embodiment of the present invention.

As mentioned, process module 130 has an opening facing load lock 120A and another opening facing load lock 120B. Referring to FIG. 1B, a wafer entering process module 130 from a load lock 120 is first placed on processing station 131A and subsequently rotated to processing stations 131B, 131C, and 131D. FIG. 7A shows a perspective view of process module 130. In FIG. 7A, top plate 133 is drawn using "invisible" lines to allow viewing of the processing stations. Each station 131 has a corresponding shower head 705 for introducing process gases overhead a wafer. Only the shower head 705 above station 131A is drawn for the sake of clarity.

Figure 1C:
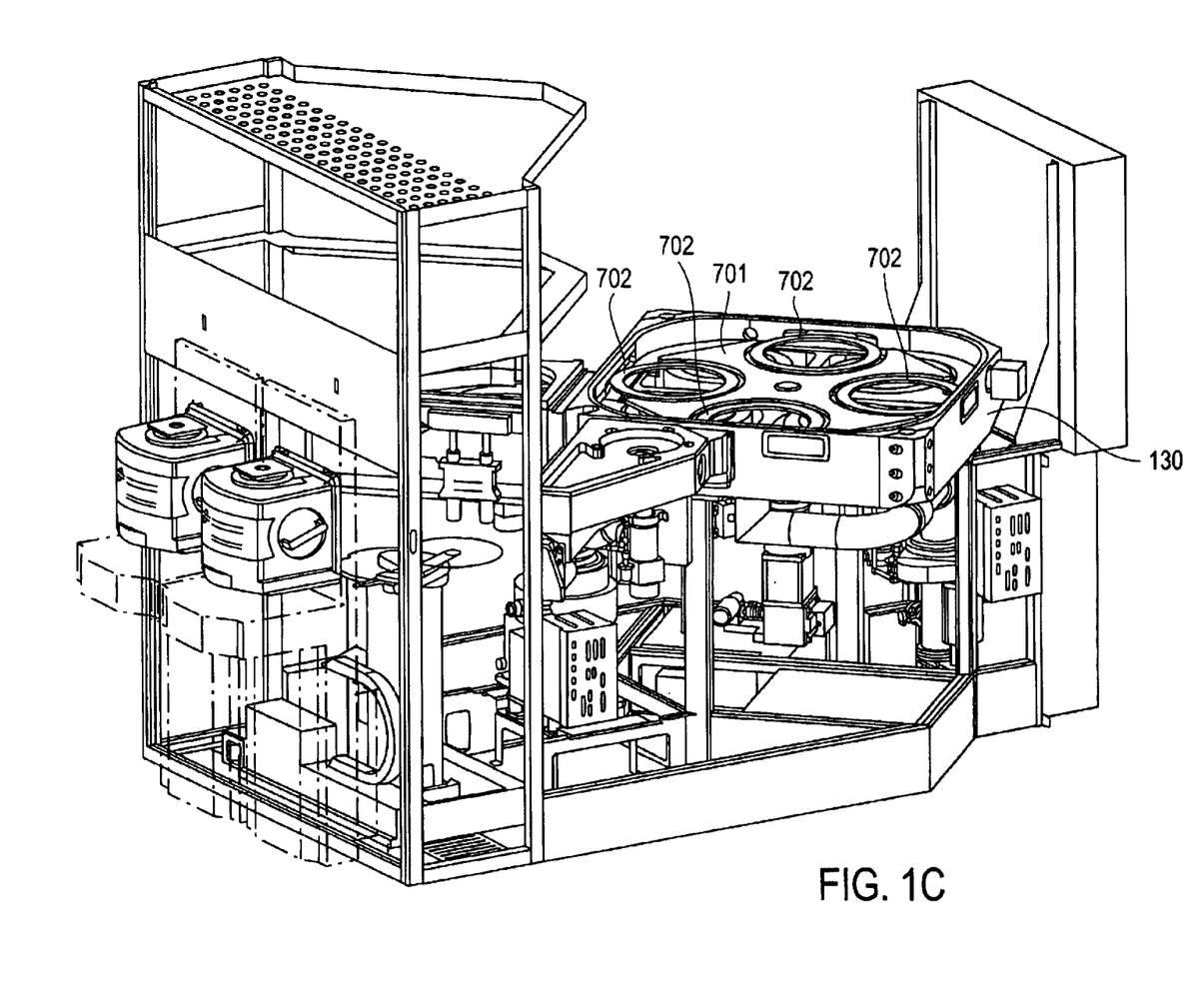

Still referring to FIG. 7A, each station 131 has a carrier ring 702 and a process pedestal 703. Carrier ring 702, which is made of ceramic material in this embodiment, freely surrounds process pedestal 703 and can thus be moved up and down. An index plate 701 supports each carrier ring 702 from underneath. FIG. 1C, which shows process module 130 without a process pedestal 703 in the processing stations for illustration purposes, provides another view of index plate 701 and carrier rings 702.

Figure 7B:
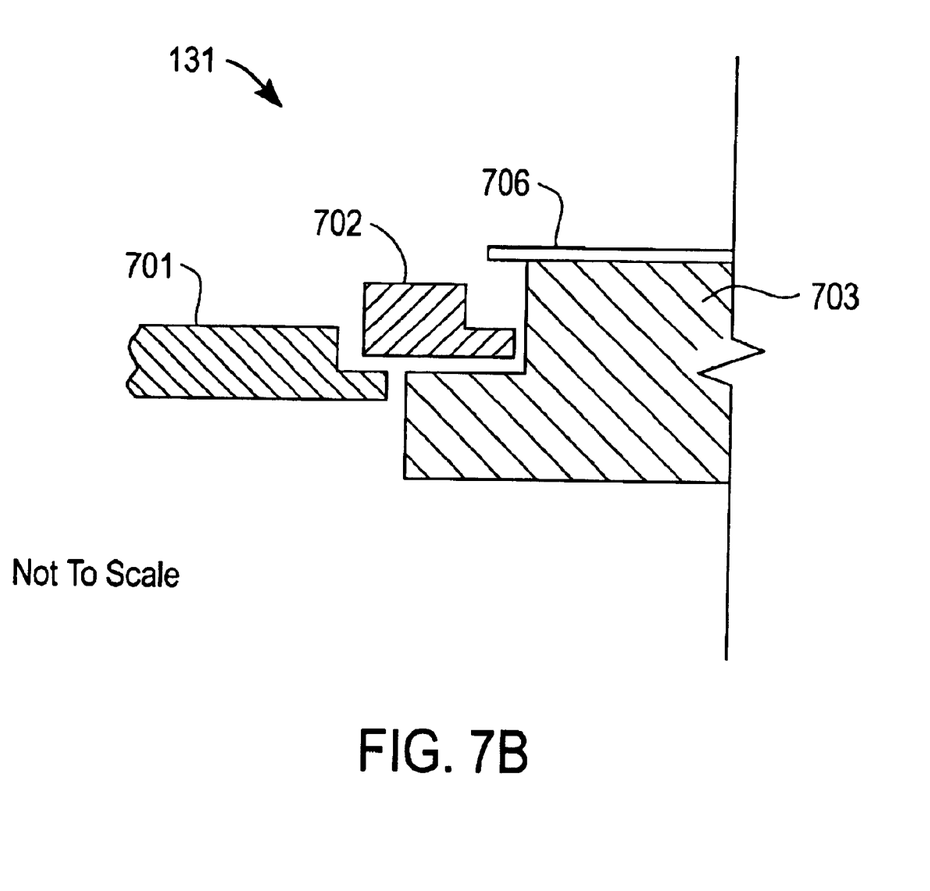
FIG. 7B schematically illustrates the mechanical relationship between the components of a processing station in accordance with an embodiment of the present invention.

FIG. 7B, which is not to scale, shows a cross sectional diagram schematically illustrating the mechanical relationship between the components of a station 131. Note that the inside diameter of carrier ring 702 is smaller than the diameter of a wafer 706 (e.g., 300 mm wafer) resting on pedestal 703. To move a wafer from one processing station to another, index plate 701 transitions to the up position, lifts carrier ring 702, which in turn lifts wafer 706. Index plate 701 then rotates wafer 706 (and the carrier ring 702 supporting the wafer) to the next processing station, and lowers to rest wafer 706 on the next pedestal 703. In the present embodiment, index plate 701 contacts a carrier ring 702 on three places shown in FIG. 7A as contact points 708 using station 131B as an example (also see contact points 708 in FIG. 7C). In FIG. 7A, center portion 707 generally indicates the spot where a conventional lifting and rotating mechanism (not shown) contacts and actuates index plate 701. Other arrangements for moving wafers in a multi-station process module (e.g., spindles) may also be used without detracting from the efficacy of the present invention.

Figure 7C:
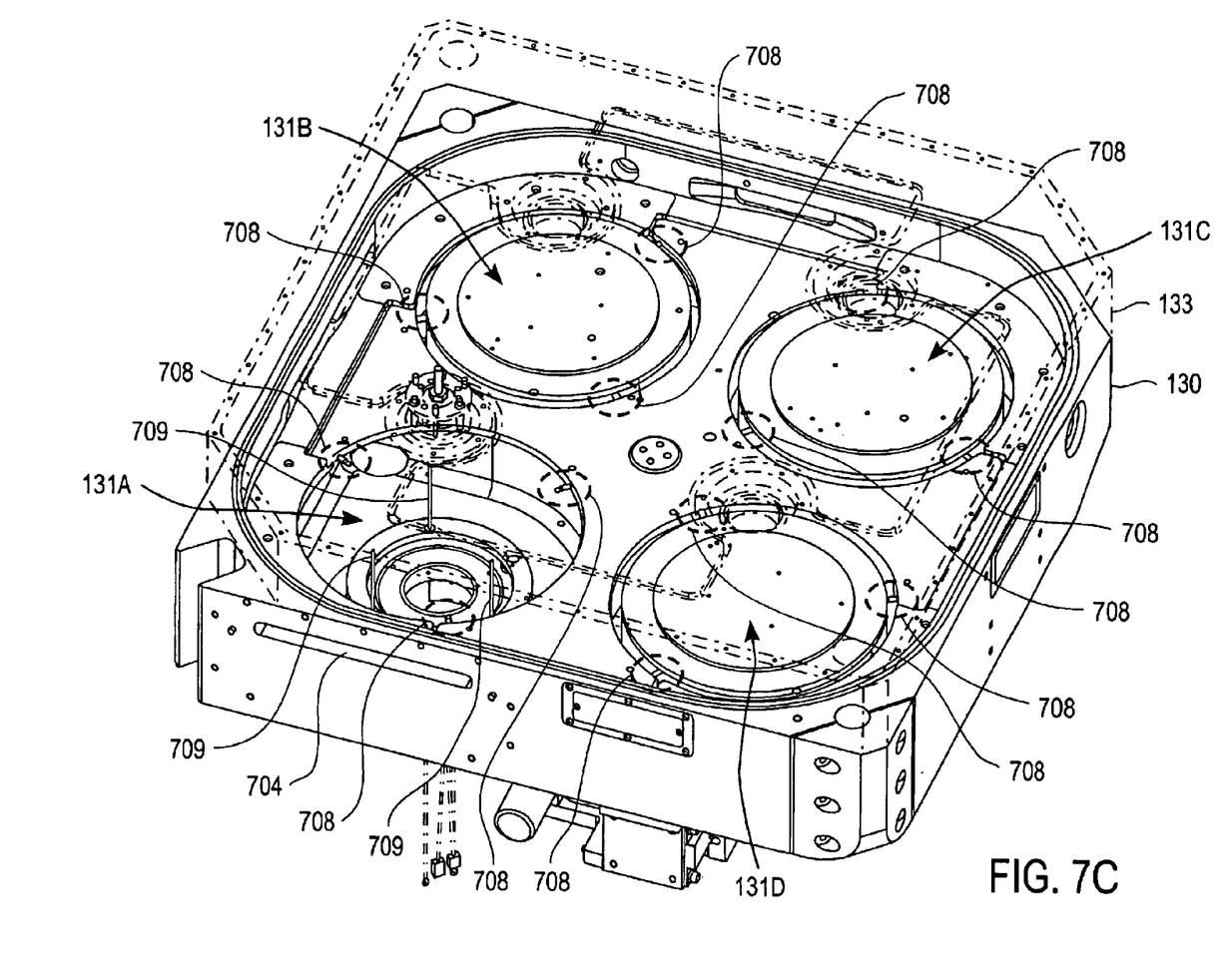

FIG. 7C shows station 131A with its pedestal 703 and carrier ring 702 removed for illustration purposes. Stations 131A, 131B, 131C, and 131D are identical except for the addition of lift pins 709 in station 131A. Lift pins 709 protrude through holes (not shown) in pedestal 703 to lift a wafer from wafer transfer mechanism 125. Once the wafer has been lifted from wafer transfer mechanism 125, lift pins 709 lower the wafer on pedestal 703. Thereafter, the wafer is transferred to the other processing stations using carrier rings 702 and index plate 701. After the wafer has been processed on all the stations, the wafer is returned to station 131A and lowered on lift pins 709 by index plate 701. Wafer transfer mechanism 125 then enters process module 130 and is positioned below the wafer. Lift pins 709 lowers the wafer on wafer transfer mechanism 125, which then retracts to its load lock 120. In FIG. 7C, the opening of process module 130 facing load lock 120A is denoted as opening 704. As mentioned, another such opening faces load lock 120B.

System 100 also includes a processor (not shown), such as an industrial grade personal computer, that is electrically coupled to a data acquisition and control system (not shown). The data acquisition and control system conventionally monitors and controls the various control element of system 100 such as motors, robots, heaters, pumps, sensors, actuators, relays, transducers, robots, valves, interlocks, etc. It is to be noted that computer programs for directing the control elements of a wafer processing system to perform a particular task, in general, are known in the art.

A power box 102 shown in FIG. 1A plugs into a standard power source and provides power to system 100.

Figure 3:
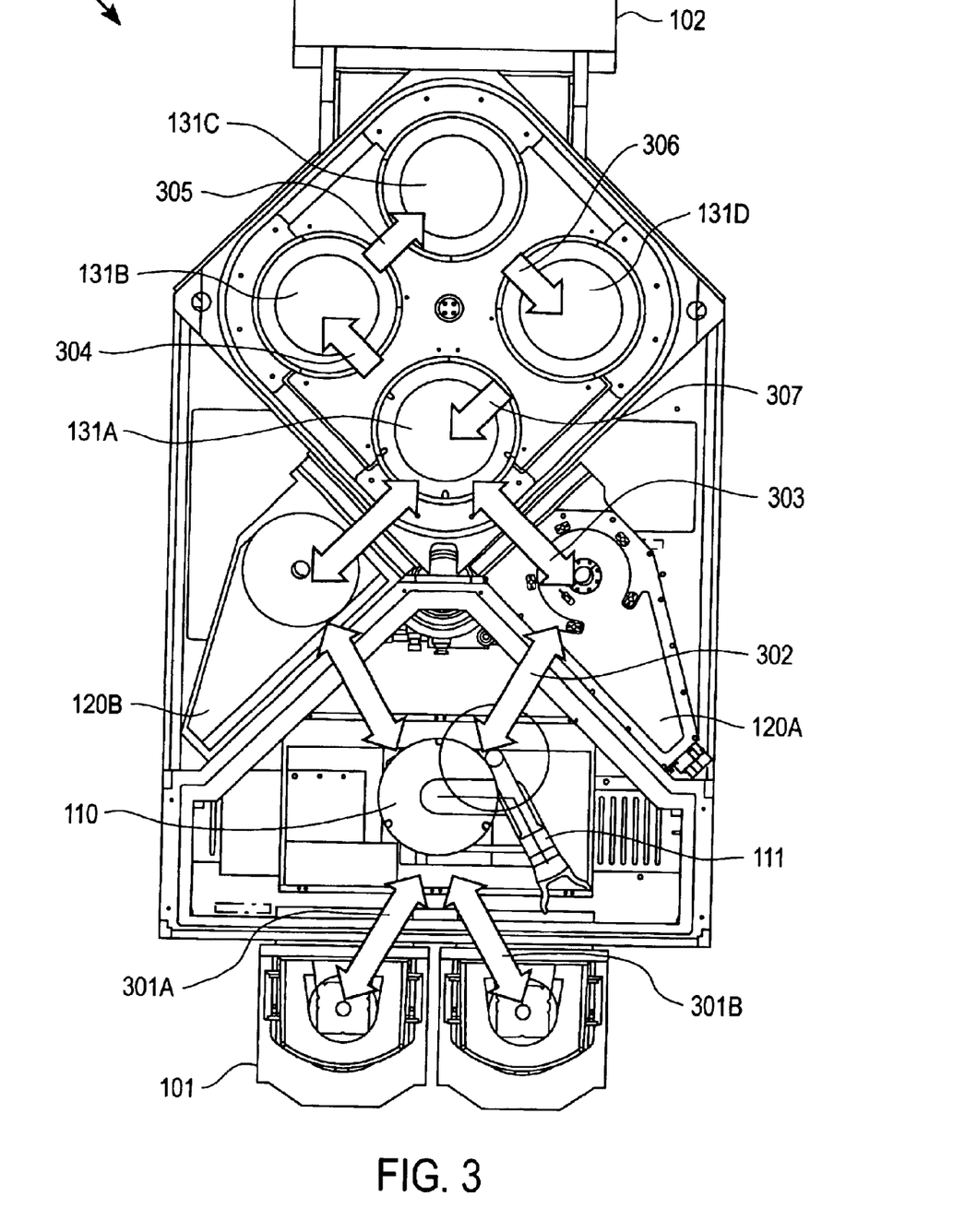
FIGS. 3 and 4 illustrate the different flow modes of a wafer processing system in accordance with an embodiment of the present invention.
Figure 4:
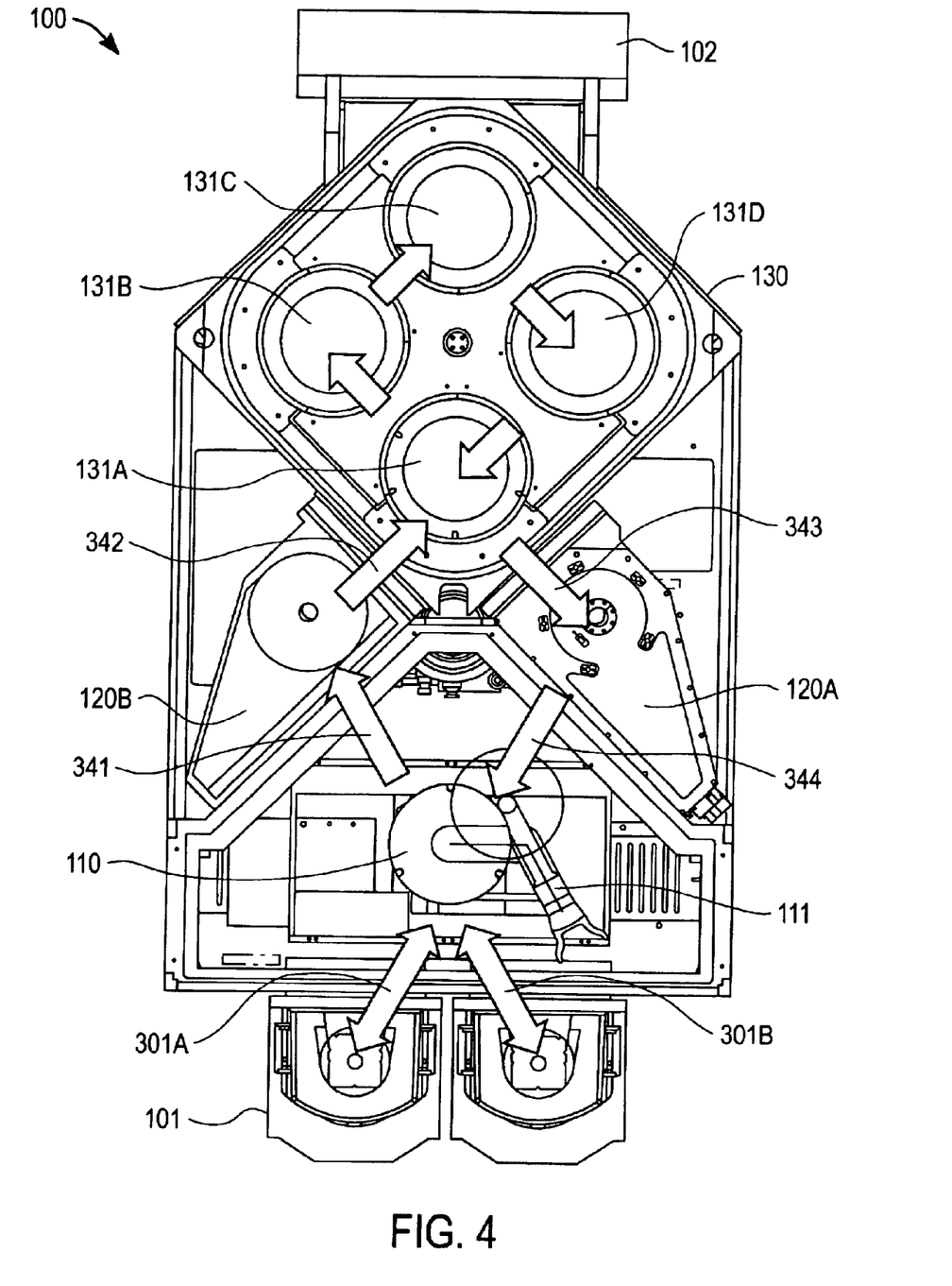

In one embodiment, system 100 can be run in bi-directional flow mode or unidirectional flow mode, illustrated with reference to the plan views of FIG. 3 and FIG. 4, respectively. In FIGS. 3 and 4, the top covers of system 100 are removed for clarity of illustration. Also, bi-directional arrows denote that wafers can travel in either direction, while unidirectional arrows denote that wafers can travel in the direction indicated. For example, the bi-directional arrows between robot 110 and loading station 101 in FIG. 3 denote that robot 110 can transport a wafer to and from loading station 101. As another example, unidirectional arrow 305 between stations 131B and 131C denotes that a wafer travels from station 131B to station 131C, but not the other way around.

In bi-directional flow mode, robot 110 can place or remove a wafer from either load lock, whichever is available. This is indicated by the bi-directional arrows from robot 110 to load locks 120A and 120B as shown in FIG. 3. An example wafer processing sequence in bi-directional flow mode is now described. A wafer in either pod of loading station 101 (bi-directional arrows 301A and 301B) is picked up by robot 110 for transfer to either load lock 120A or 120B, whichever is available. If load lock 120A is available, its opening facing robot 110 is opened to allow arm 111 of robot 110 to rest the wafer on wafer transfer mechanism 125 (bi-directional arrow 302). After robot 110 retracts from load lock 120A, pedestal 126 lifts the wafer from wafer transfer mechanism 125. Load lock 120A is sealed (i.e., all load lock openings are closed) and pumped down to vacuum. When the pressures in load lock 120A and process module 130 are equalized, pedestal 126 lowers the wafer on wafer transfer mechanism 125 and the opening of load lock 120A facing process module 130 is opened. Wafer transfer mechanism 125 then moves the wafer over station 131A (bi-directional arrow 303). Lift pins 109 lift the wafer from wafer transfer mechanism 125, which then retracts back into load lock 120A. Thereafter, lift pins 109 lower the wafer on pedestal 703 of station 131A, and the opening of load lock 120A facing process module 130 is closed.

In one embodiment involving the deposition of thin film dielectric materials, station 131A is configured to heat the wafer by, for example, flowing a heat conducting gas such as helium underneath the wafer while activating heating elements such as resistive heating elements (not shown) embedded in pedestal 703 of station 131A. Process gases are introduced in process module 130 via a shower head 705 above each processing station. From station 131A, the wafer is then processed at stations 131B, 131C, and 131D (unidirectional arrows 304, 305, and 306, respectively) before being transferred back to station 131A (unidirectional arrow 307) and rested on lift pins 709. From station 131A, the wafer is moved to either load lock 120A or 120B, whichever is available. If load lock 120A is available, the opening of load lock 120A facing process module 130 is opened to allow wafer transfer mechanism 125 to be positioned underneath the wafer. Lift pins 709 lower the wafer onto wafer transfer mechanism 125, which then retracts to load lock 120A (bi-directional arrow 303). The opening facing process module 130 is closed, and the wafer is lifted from wafer transfer mechanism 125 by pedestal 126. Load lock 120A is then vented to atmospheric pressure while the wafer is cooled by pedestal 126 by flowing a coolant in its embedded channel 201 (see FIG. 2C). After load lock 120A is vented, pedestal 126 lowers the wafer onto wafer transfer mechanism 125, and the opening of load lock 120A facing robot 110 is opened to allow robot 110 to pick-up the wafer (bi-directional arrow 302). Thereafter, the wafer is placed back to its pod in loading station 101 (bi-directional arrows 301A and 301B).

In unidirectional flow mode, one load lock is designated for transferring incoming wafers from loading station 101 to process module 130 while another load lock is designated for transferring outgoing wafers from process module 130 to loading station 101. Referring to FIG. 4, there is shown a plan view of system 100 configured for unidirectional flow mode. In FIG. 4, load lock 120B accepts incoming wafers from loading station 101 (unidirectional arrow 341). Depending on the fabrication process, the wafer may be heated on pedestal 126 while the pressure in load lock 120B is equalized to that of process module 130. By pre-heating the wafer in load lock 120B, station 131A of process module 130 is freed up for use as a deposition station. Further, pre-heating the wafer in load lock 120B improves the throughput of system 100 by eliminating the need to transfer the wafer to a separately located heating station or the need to spend time being pre-heated in station 131A. The wafer from load lock 120B is then processed at stations 131A (unidirectional arrow 342), 131B, 131C, and 131D before being returned back to station 131A. From station 131A, the newly processed wafer coming out of process module 130 is transferred to load lock 120A (unidirectional arrow 343), which cools the wafer with its pedestal 126 while venting. Thereafter, the wafer is picked up by robot 110 (unidirectional arrow 344) and returned to a pod in loading station 101.

Except for the use of station 131A as a deposition station and the unidirectional flow of wafers through load locks 120A and 120B in unidirectional flow mode, the operation of system 100 in bi-directional and unidirectional flow modes is otherwise the same. In light of the present disclosure, persons of ordinary skill in the art can appreciate that the movement of wafers in system 100 is not limited to the aforementioned flow modes and can be tailored to meet specific requirements.

For the sake of clarity, the just described examples illustrate the processing of a single wafer. It is to be noted, however, that system 100 can process multiple wafers at the same time. For example, an incoming wafer can be heated in load lock 120B at the same time an outgoing wafer is being cooled in load lock 120A. As another example, the load locks 120 can be synchronized such that a wafer is transferred from load lock 120B to station 131A at the same time another wafer is being transferred from station 131A to load lock 120A. Further, the movement of wafers in process module 130 can be clockwise or counter-clockwise.

As is evident from the foregoing, system 100 is capable of continuous processing because process module 130 is buffered from atmospheric pressure by load locks 120A and 120B, allowing process module 130 to be maintained at a predetermined pressure during normal operation. That is, process module 130 can continuously process wafers without having to perform pump down and vent cycles. The continuous processing capability of system 100 combined with the small volume, adjacency to the process module, and integrated heating/cooling units of load locks 120A and 120B result in a a throughput limited only by process time.

Figure 5:
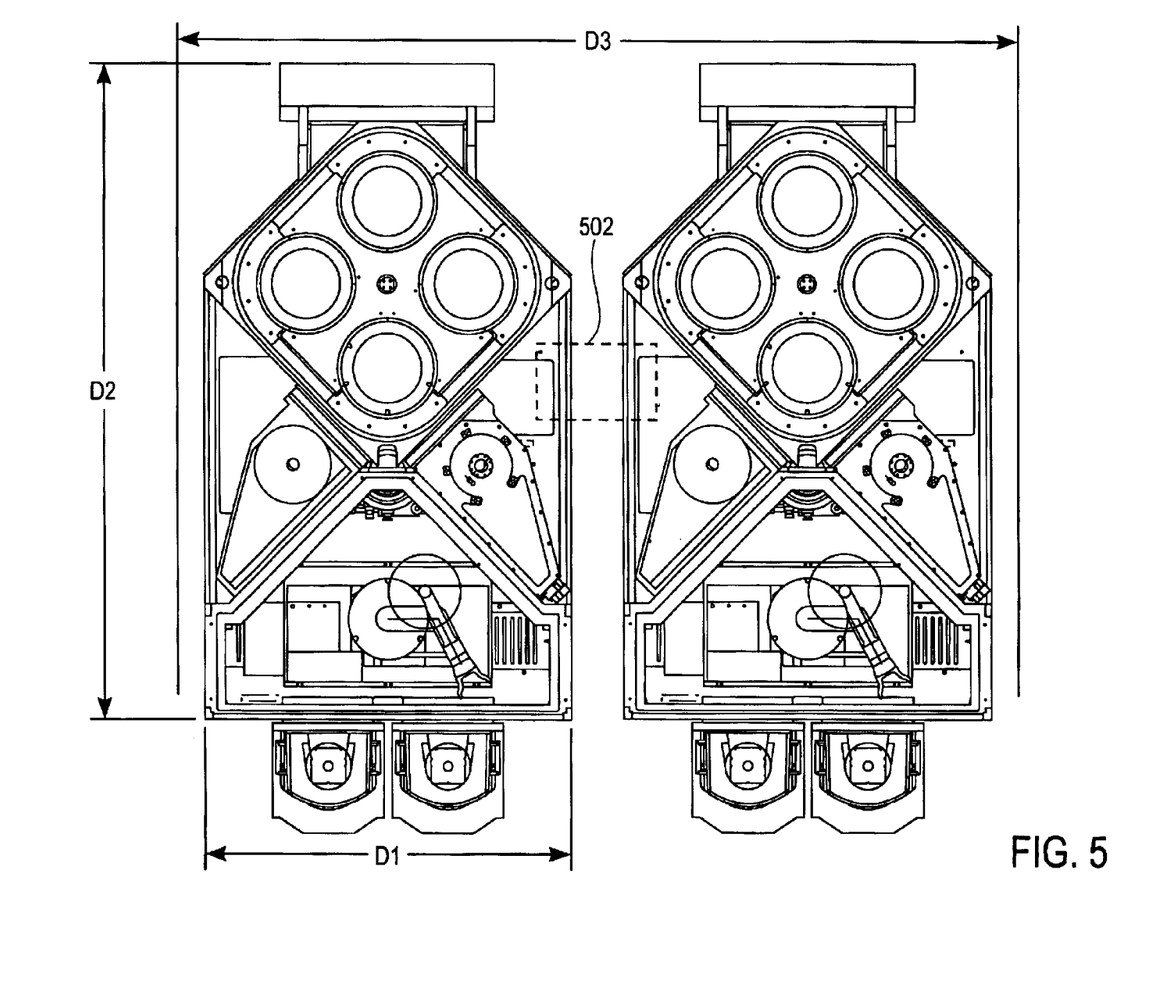
FIG. 5 shows a plan view of two side-by-side wafer processing systems in accordance with an embodiment of the present invention.

Because a wafer is transferred from a load lock directly to the process module and vice versa, an intermediate chamber (e.g., transfer chamber) between the load locks and the process module is not required. This not only improves the throughput of the present wafer processing system, but also lowers its cost, complexity, and foot print as well. The reduced footprint of the present wafer processing system is demonstrated with reference to the plan view of FIG. 5. In one embodiment, a system 100 configured for 300 mm wafers has a dimension D1 of about 62 inches and a dimension D2 of about 106 inches. Placing two system 100s side-by-side results in a dimension D3 of about 126 inches. Note that a wide maintenance aisle between two system 100s is not required because there is ample room for a maintenance person to work in the area generally enclosed by area 502.

An architecture for a high throughput wafer processing system has been disclosed. The architecture may be employed in its entirety, or selectively using any of its individual features. Further, while specific embodiments have been discussed, it is to be understood that these embodiments are provided for illustration purposes and not limiting. Many other embodiments in accordance with the teachings of this disclosure will be readily apparent to persons of ordinary skill in the art. Thus, the present invention is limited only by the following claims.

What is claimed is:

1. A wafer processing system comprising:

a loading station;

a process chamber maintained at a predetermined pressure during normal operation, the process chamber having a plurality of processing stations;

a first single-wafer load lock having a single wafer support, the first single-wafer load lock being coupled to receive a wafer originating from the loading station, the first single-wafer load lock including a transfer mechanism configured to directly transfer a wafer between the first single-wafer load lock and the process chamber along a substantially straight path;

a second single-wafer load lock having a single wafer support, the second single-wafer load lock including a transfer mechanism configured to directly transfer a wafer between the second single-wafer load lock and the process chamber; and a pump coupled only to the first and second single-wafer load locks, the pump being located locally on the wafer processing system.

2. The system of claim 1 wherein the loading station includes a front-opening unified pod (FOUP).

3. The system of claim 1 further comprising a robot between the loading station and the first single-wafer load lock.

4. A wafer processing system comprising:

a loading station;

a process chamber maintained at vacuum during normal processing;

a plurality of load locks, each of the plurality of load locks having an opening in direct communication with the process chamber and another opening in communication with the loading station, each of the plurality of load locks including a single wafer support and a transfer mechanism configured to transfer a wafer between a load lock and the process chamber; and a robot between the loading station and the plurality of load locks, the robot capable of transferring a wafer from the loading station to a load lock in the plurality of load locks;

wherein each of the plurality of load locks includes a single pedestal having an integrated cooling unit.

5. The system of claim 4, wherein the robot is an atmospheric robot.

6. The system of claim 4, wherein the loading station is a front-opening unified pod (FOUP).

7. The system of claim 4 wherein the process chamber has a plurality of processing stations.

8. The system of claim 7 wherein at least one of the plurality of processing stations is capable of heating a supported wafer.

9. A wafer processing system comprising:

a loading station;

a process chamber maintained at a predetermined pressure during normal operation, the process chamber having a plurality of processing stations; and a first single-wafer load lock having a single wafer support, the first single-wafer load lock being coupled to receive a wafer originating from the loading station, the first single-wafer load lock including a transfer mechanism configured to directly transfer a wafer between the first single-wafer load lock and the process chamber along a substantially straight path;

wherein the single wafer support of the first single-wafer load lock includes a pedestal having an integral cooling unit.

10. A wafer processing system comprising:

a loading station;

a process chamber maintained at a predetermined pressure during normal operation, the process chamber having a plurality of processing stations; and a first single-wafer load lock having a single wafer support, the first single-wafer load lock being coupled to receive a wafer originating from the loading station, the first single-wafer load lock including a transfer mechanism configured to directly transfer a wafer between the first single-wafer load lock and the process chamber along a substantially straight path;

wherein the single wafer support of the first single-wafer load lock includes a single pedestal having an integral heating unit.

11. A wafer processing system comprising:

a loading station;

a process chamber maintained at vacuum during normal processing;

a plurality of load locks, each of the plurality of load locks having an opening in direct communication with the process chamber and another opening in communication with the loading station, each of the plurality of load locks including a single wafer support and a transfer mechanism configured to transfer a wafer between a load lock and the process chamber; and a robot between the loading station and the plurality of load locks, the robot capable of transferring a wafer from the loading station to a load lock in the plurality of load locks;

wherein each of the plurality of load locks includes a single pedestal having an integrated heating unit.

12. The system of claim 11 wherein the loading station is a front-opening unified pod (FOUP).

13. The system of claim 11 wherein the process chamber has a-plurality of processing stations.

14. The system of claim 13 wherein at least one of the plurality of processing stations is capable of heating a supported wafer.

15. The system of claim 11 wherein the robot is an atmospheric robot.

* * * * *